United States Patent
Lee et al.

(10) Patent No.: US 11,784,645 B2
(45) Date of Patent: Oct. 10, 2023

(54) LEVEL SHIFTER INCLUDING DUMMY CIRCUIT AND METHOD OF MANUFACTURING THE SAME

(71) Applicant: LX Semicon Co., Ltd., Daejeon (KR)

(72) Inventors: Chung Min Lee, Daejeon (KR); Hun Yong Lim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 19 days.

(21) Appl. No.: 17/548,310

(22) Filed: Dec. 10, 2021

(65) Prior Publication Data
US 2022/0200598 A1     Jun. 23, 2022

(30) Foreign Application Priority Data
Dec. 18, 2020    (KR) ........................ 10-2020-0178855

(51) Int. Cl.
*H03K 3/356*     (2006.01)
*H03K 19/0185*     (2006.01)
*H03K 19/003*     (2006.01)

(52) U.S. Cl.
CPC ............ *H03K 19/018521* (2013.01); *H03K 19/00315* (2013.01)

(58) Field of Classification Search
CPC ................ H03K 19/00315; H03K 19/018521
See application file for complete search history.

(56) References Cited

U.S. PATENT DOCUMENTS

| | | | | |
|---|---|---|---|---|
| 4,767,946 A * | 8/1988 | Taylor | ..................... | H03F 3/50 330/296 |
| 5,969,542 A * | 10/1999 | Maley | .................. | H03K 17/102 326/17 |
| 6,184,737 B1 * | 2/2001 | Taguchi | .............. | H04L 25/0292 327/321 |
| 6,642,769 B1 * | 11/2003 | Chang | .............. | H03K 3/356147 327/333 |
| 6,806,734 B2 | 10/2004 | Cairns et al. | | |
| 8,643,425 B2 * | 2/2014 | Chaudhry | ........ | H03K 3/356182 327/306 |
| 10,615,782 B2 * | 4/2020 | Kashihara | .......... | G11C 16/0425 |
| 2003/0173995 A1 | 9/2003 | Cairns et al. | | |
| 2004/0000929 A1 * | 1/2004 | Aoki | ................ | H03K 3/356113 326/68 |
| 2012/0216089 A1 * | 8/2012 | Chen | .................. | G01R 31/3177 700/121 |
| 2018/0287615 A1 * | 10/2018 | Pan | ................ | H03K 19/018528 |
| 2022/0276381 A1 * | 9/2022 | Masuda | .................. | H04N 23/60 |

FOREIGN PATENT DOCUMENTS

| | | |
|---|---|---|
| KR | 10-0514029 B1 | 9/2005 |
| KR | 10-2113666 B1 | 5/2020 |

* cited by examiner

*Primary Examiner* — Kurtis R Bahr
(74) *Attorney, Agent, or Firm* — ROTHWELL, FIGG, ERNST & MANBECK, P.C.

(57) ABSTRACT

The present disclosure provides a technology for a level shifter that allows the selection of a single-stage level shifter or a two-stage level shifter by a simple alteration to wiring. When the single-stage level shifter is selected, some circuits may remain as dummy circuits.

11 Claims, 7 Drawing Sheets

LEVEL SHIFTER INCLUDING DUMMY CIRCUIT AND METHOD OF MANUFACTURING THE SAME

CROSS REFERENCE TO RELATED APPLICATION

This application claims priority from Korean Patent Application No. 10-2020-0178855, filed on Dec. 18, 2020, which is hereby incorporated by reference for all purposes as if fully set forth herein.

BACKGROUND OF THE DISCLOSURE

Field of the Disclosure

The present disclosure relates to a level shifter.

Related Art

Each of electrical devices such as displays may include a level shifter for translating voltage signals from one voltage level to a required voltage level.

The level shifter may convert an input signal of a low-voltage level to an output signal of a high-voltage level or convert an input signal of a high-voltage level to an output signal of a low-voltage level.

The level shifter may take a variety of forms, and these forms are determined mainly by the environment for using electrical devices in which the level shifter is applied. The level shifter designer will design the level shifter to suit different environments of usage based upon an understanding of these environments.

With the diversification of electrical devices into a wide variety of applications over recent years, there is a demand for diversity in the design of level shifters. However, such a diversity in design may increase the designer's workload and cause an increase in manufacturing costs.

SUMMARY OF THE DISCLOSURE

An aspect of the present disclosure is to provide a technology for a level shifter which is easy in design alteration. Another aspect of the present disclosure is to provide a technology for manufacturing a level shifter that allows for selecting a single-stage level shifter or a two-stage level shifter simply by making alteration to wiring.

In an aspect, the present disclosure provides a level shifter comprising: a level shifter circuit comprising a first transistor that turns on and off by an input voltage to produce a voltage at an inverting node to have an inverted waveform of the input voltage and a second transistor that turns on and off by an inverted voltage having the inverted waveform of the input voltage to produce a voltage at an output node to have the same waveform as the input voltage; and a dummy circuit comprising a first dummy transistor whose gate terminal and source terminal are short-circuited by a first short-circuit line and a second dummy transistor whose gate terminal and source terminal are short-circuited by a second short-circuit line, the dummy circuit being operable as a two-stage level shifter circuit when the first short-circuit line and the second short-circuit line are removed.

When the dummy circuit operates as the two-stage level shifter circuit, an output voltage may be determined by a voltage at a drain terminal of the second dummy transistor, and an inverted output voltage may be determined by a voltage at a drain terminal of the first dummy transistor.

The first transistor and the first dummy transistor may be different types of transistors, and the second transistor and the second dummy transistor may be different types of transistors.

In another aspect, the present disclosure provides a level shifter comprising: a first path circuit in which a first transistor and a third transistor are disposed in series between a high driving voltage and a low driving voltage; a second path circuit in which a second transistor and a fourth transistor are disposed in series between the high driving voltage and the low driving voltage; a third path circuit in which a first dummy transistor and a third dummy transistor are disposed in series between the high driving voltage and the low driving voltage; and a fourth path circuit in which a second dummy transistor and a fourth dummy transistor are disposed in series between the high driving voltage and the low driving voltage, wherein an input voltage is fed to a gate terminal of the first transistor, an inverted voltage having an inverted waveform of the input voltage is fed to a gate terminal of the second transistor, a drain terminal of the first transistor is electrically connected to an output node, a drain terminal of the second transistor is electrically connected to an inverting node, the output node is electrically connected to a gate terminal of the fourth transistor, and the inverting node is electrically connected to a gate terminal of the third transistor, and wherein a gate terminal and source terminal of the first dummy transistor are short-circuited by a first short-circuit line, and a gate terminal and source terminal of the second dummy transistor are short-circuited by a second short-circuit line.

A drain terminal of the first dummy transistor may be electrically connected to a gate terminal of the fourth dummy transistor, and a drain terminal of the second dummy transistor may be electrically connected to a gate terminal of the third dummy transistor.

In still another aspect, the present disclosure provides a manufacturing method of a level shifter, the method comprising: placing a transistor mask; forming a first transistor, a second transistor, a first dummy transistor, and a second dummy transistor in alignment with the transistor mask; placing a metal mask; and installing wiring using the metal mask in such a way that the first transistor turns on and off by an input voltage to produce a voltage at an inverting node to have an inverted waveform of the input voltage, in such a way that the second transistor turns on and off by an inverted voltage having the inverted waveform of the input voltage to produce a voltage at an output node to have the same waveform as the input voltage, in such a way that the gate terminal and source terminal of the first dummy transistor are short-circuited, and in such a way that the gate terminal and source terminal of the second dummy transistor are short-circuited.

The manufacturing method may further comprise, after the installing of wiring, forming a passivation layer and exposing the output node and the inverting node through the passivation layer.

The first dummy transistor and the second dummy transistor may form a two-stage level shifter circuit according to an alteration to the metal mask.

In the forming of transistors, a first dummy limiting transistor for limiting the amount of current flowing to the first dummy transistor and a second dummy limiting transistor for limiting the amount of current flowing to the second dummy transistor may be further formed, and, in the installing of wiring, the wiring may be installed in such a way that a gate terminal and source terminal of the first dummy limiting transistor and a gate terminal and source terminal of the second dummy limiting transistor are short-circuited.

A further exemplary embodiment of the present disclosure provides a level shifter comprising: a level shifter circuit comprising a first transistor that turns on and off by an input voltage to produce a voltage at an inverting node to have an inverted waveform of the input voltage and a second transistor that turns on and off by an inverted voltage having the inverted waveform of the input voltage to produce a voltage at an output node to have the same waveform as the input voltage; and a dummy circuit comprising transistors configured in the form of a two-stage level shifter circuit, the transistors comprising a first dummy transistor and a second dummy transistor whose gate terminals and source terminals are short-circuited.

As explained above, according to an embodiment of the present disclosure, altering the design of a level shifter can be made easier, and a single-stage shifter or a two-stage level shifter can be selected simply by altering the wiring in the manufacturing process.

DESCRIPTION OF EXEMPLARY EMBODIMENTS

Figure 1:
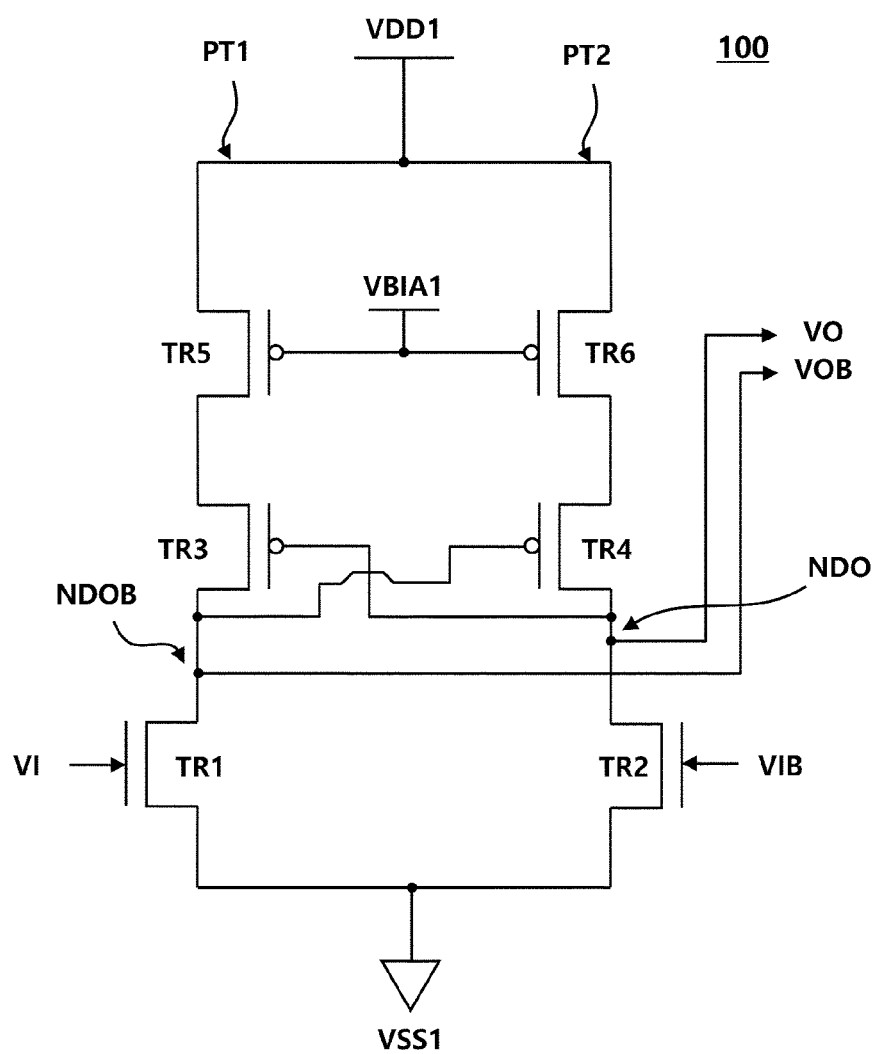
FIG. 1 is a circuit diagram of a single-stage level shifter.

FIG. 1 is a circuit diagram of a single-stage level shifter.
Referring to FIG. 1, the level shifter 100 may include a first path circuit PT1 and a second path circuit PT2 which are formed between a first high driving voltage VDD1 and a first low driving voltage VSS1.

The first high driving voltage VDD1 may be electrically connected to one side of the first path circuit PT1, and the first low driving voltage VSS1 may be electrically connected to the other side, and a current may flow from the first high driving voltage VDD1 to the first low driving voltage VSS1 via the first path circuit PT1.

The first path circuit PT1 may include a first transistor TR1, a third transistor TR3, and a fifth transistor TR5. Also, the first transistor TR1, the third transistor TR3, and the fifth transistor TR5 may be connected in series to each other.

Although FIG. 1 illustrates the first transistor TR1 as an N-type transistor and the third transistor TR3 and the fifth transistor TR5 as P-type transistors for convenience of explanation, the present disclosure is not limited to this.

An input voltage VI may be supplied to a gate terminal of the first transistor TR1. Also, the first transistor TR1 may turn on and off according to the voltage level of the input voltage VI.

A source terminal of the first transistor TR1 may be connected to the first low driving voltage VSS1, and a drain terminal thereof may be connected to an inverting node NDOB. With this structure, when an input voltage VI of a high-voltage level is supplied to the gate terminal of the first transistor TR1, an inverted output voltage VOB of a low-voltage level may be produced at the inverting node NDOB.

A gate terminal of the third transistor TR3 may be connected to an output node NDO. Also, a source terminal of the third transistor TR3 may be electrically connected to the first high driving voltage VDD1, and a drain terminal thereof may be connected to the inverting node NDOB. As described later, an output voltage VO having the same waveform as the input voltage VI may be produced at the output node NDO. The third transistor TR3 may turn on and off by the output voltage VO. With this structure, when an input voltage VI of a low-voltage level is supplied, an inverted output voltage VOB of a high-voltage level may be produced at the inverting node NDOB.

The fifth transistor TR5 may limit the amount of current flowing to the first path circuit PT1.

A gate terminal of the fifth transistor TR5 may be supplied with a first bias voltage VBIA1. Also, a source terminal of the fifth transistor TR5 may be connected to the first high driving voltage VDD1, and a drain terminal thereof may be connected to the source terminal of the third transistor TR3.

The first high driving voltage VDD1 may be electrically connected to one side of the second path circuit PT2, and the first low driving voltage VSS1 may be electrically connected to the other side, and a current may flow from the first high driving voltage VDD1 to the first low driving voltage VSS1 via the second path circuit PT2.

The second path circuit PT2 may include a second transistor TR2, a fourth transistor TR4, and a sixth transistor TR6. Also, the second transistor TR2, the fourth transistor TR4, and the sixth transistor TR6 may be connected in series to each other.

Although FIG. 1 illustrates the second transistor TR2 as an N-type transistor and the fourth transistor TR4 and the sixth transistor TR6 as P-type transistors for convenience of explanation, the present disclosure is not limited to this.

An inverted voltage VIB may be supplied to a gate terminal of the second transistor TR2. Also, the second transistor TR2 may turn on and off according to the voltage level of the inverted voltage VIB.

A source terminal of the second transistor TR2 may be connected to the first low driving voltage VSS1, and a drain terminal thereof may be connected to an output node NDO. With this structure, when an inverted voltage VIB of a high-voltage level is supplied to the gate terminal of the second transistor TR2, an output voltage VO of a low-voltage level may be produced at the output node NDO. The output voltage VO may have the same waveform as the input voltage VI since the inverted voltage VIB is a voltage having an inverted waveform of the input voltage VI.

A gate terminal of the fourth transistor TR4 may be connected to the inverting node NDOB. Also, a source terminal of the fourth transistor TR4 may be electrically connected to the first high driving voltage VDD1, and a drain terminal thereof may be connected to the output node NDO.

As described above, an inverted output voltage VOB having the same waveform as the inverted voltage VIB may be produced at the inverting node NDOB. The fourth transistor TR4 may turn on and off by the inverted output voltage VOB. With this structure, when an inverted voltage VIB of a low-voltage level is supplied, an inverted output voltage VOB of a high-voltage level may be produced at the output node NDO.

The sixth transistor TR6 may limit the amount of current flowing to the second path circuit PT2.

A gate terminal of the sixth transistor TR6 may be supplied with the first bias voltage VBIA1.

Also, a source terminal of the sixth transistor TR6 may be connected to the first high driving voltage VDD1, and a drain terminal thereof may be connected to the source terminal of the fourth transistor TR4.

Figure 2:
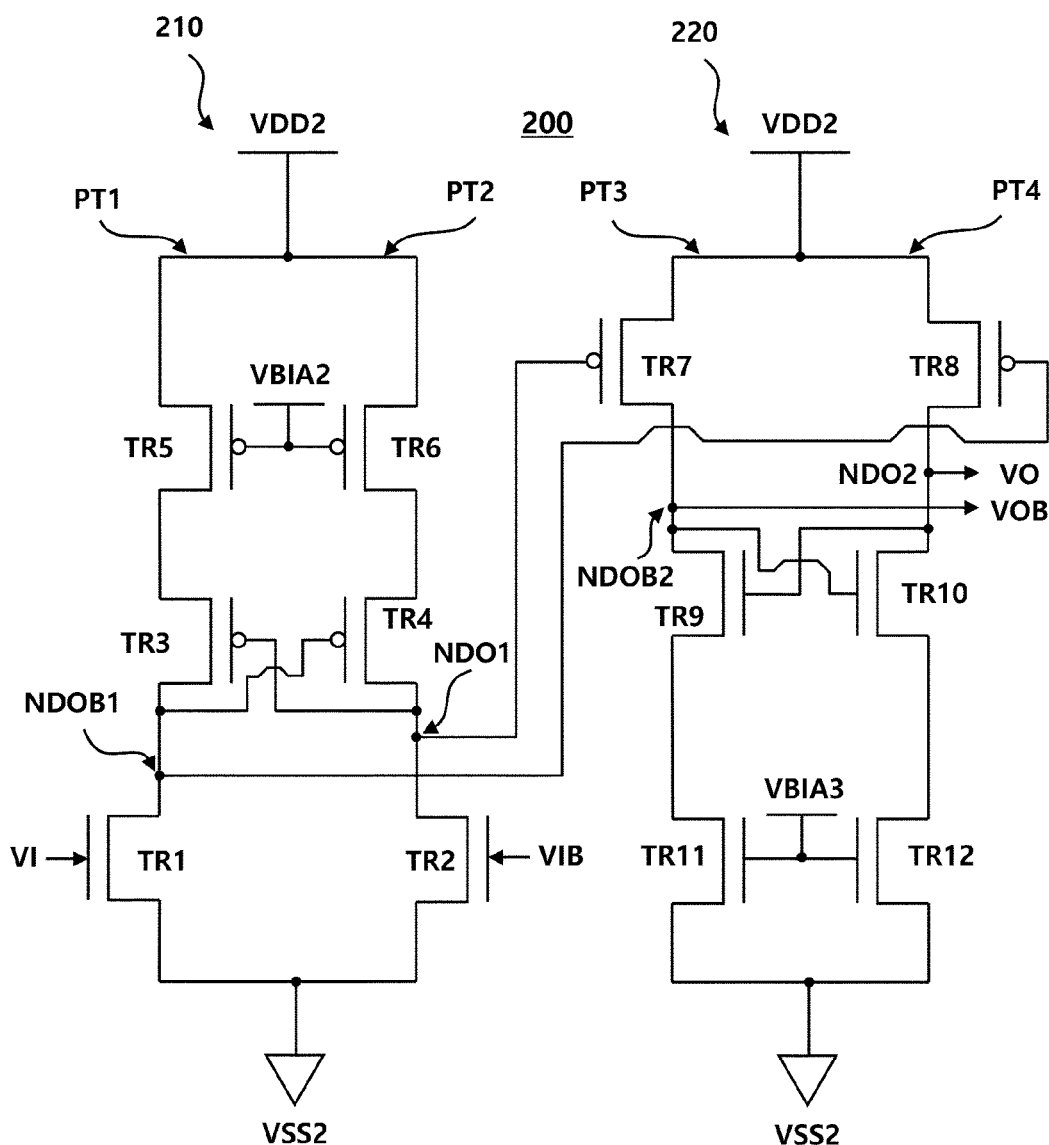
FIG. 2 is a circuit diagram of a two-stage level shifter.

FIG. 2 is a circuit diagram of a two-stage level shifter.

Referring to FIG. 2, the level shifter 200 may include a single-stage circuit 210 and a two-stage circuit 220.

The single-stage circuit 210 may include a first path circuit PT1 and a second path circuit PT2. The single-stage circuit 210 may have the same circuit configuration as the single-stage level shifter (see 100 of FIG. 1) explained with reference to FIG. 1. Accordingly, a detailed description of the single-stage circuit 210 will be omitted.

A difference between the single-stage level shifter (see 100 of FIG. 1) depicted in FIG. 1 and the single-stage circuit 210 is that a second high driving voltage VDD2 is fed as high driving voltage, a second low driving voltage VSS2 is fed as low driving voltage, and a second bias voltage VBIA2 is fed to the fifth transistor TR5 and the sixth transistor TR6.

Also, another difference between the single-stage circuit 210 and the single-stage level shifter (see 100 of FIG. 1) depicted in FIG. 1 is that the output of the single-stage circuit 210 is connected to the input of the two-stage circuit 220. To represent this difference, the output node of the single-stage level shifter (see 100 of FIG. 1) depicted in FIG. 1 is called a first output node NDO1, and the inverting node thereof is called a first inverting node NDOB1.

The two-stage circuit 210 may include a third path circuit PT3 and a fourth path circuit PT4.

The second high driving voltage VDD2 may be electrically connected to one side of the third path circuit PT3, and the second low driving voltage VSS2 may be electrically connected to the other side, and a current may flow from the second high driving voltage VDD2 to the second low driving voltage VSS2 via the third path circuit PT3.

The third path circuit PT3 may include a seventh transistor TR7, a ninth transistor TR9, and an eleventh transistor TR11. Also, the seventh transistor TR7, the ninth transistor TR9, and the eleventh transistor TR11 may be connected in series to each other.

Although FIG. 2 illustrates the seventh transistor TR7 as a P-type transistor and the ninth transistor TR9 and the eleventh transistor TR11 as N-type transistors for convenience of explanation, the present disclosure is not limited to this.

A gate terminal of the seventh transistor TR7 may be connected to the first output node NDO1 of the single-stage circuit 210. Also, the seventh transistor TR7 may turn on and off according to the voltage level at the first output node NDO1.

A source terminal of the seventh transistor TR7 may be connected to the second high driving voltage VDD2, and a drain terminal thereof may be connected to a second inverting node NDOB2. With this structure, when an input voltage VI of a low-voltage level is supplied to the gate terminal of the seventh transistor TR7, an inverted output voltage VOB of a high-voltage level may be produced at the second inverting node NDOB2.

A gate terminal of the ninth transistor TR9 may be connected to a second output node NDO2. Also, a source terminal of the ninth transistor TR9 may be electrically connected to the second low driving voltage VSS2, and a drain terminal thereof may be connected to the second inverting node NDOB2. As described later, an output voltage VO having the same waveform as the input voltage VI may be produced at the second output node NDO2. The ninth transistor TR9 may turn on and off by the output voltage VO. With this structure, when an input voltage VI of a high-voltage level is supplied, an inverted output voltage VOB of a low-voltage level may be produced at the second inverting node NDOB2.

The eleventh transistor TR11 may limit the amount of current flowing to the third path circuit PT3.

A gate terminal of the eleventh transistor TR11 may be supplied with a third bias voltage VBIA3. Also, a source terminal of the eleventh transistor TR11 may be connected to the second low driving voltage VSS2, and a drain terminal thereof may be connected to the source terminal of the ninth transistor TR9.

The second high driving voltage VDD2 may be electrically connected to one side of the fourth path circuit PT4, and the second low driving voltage VSS2 may be electrically connected to the other side, and a current may flow from the second high driving voltage VDD2 to the second low driving voltage VSS2 via the fourth path circuit PT4.

The fourth path circuit PT4 may include an eighth transistor TR8, a tenth transistor TR10, and a twelfth transistor TR12. Also, the eighth transistor TR8, the tenth transistor TR10, and the twelfth transistor TR12 may be connected in series to each other.

Although FIG. 2 illustrates the eighth transistor TR8 as a P-type transistor and the tenth transistor TR10 and the twelfth transistor TR12 as N-type transistors for convenience of explanation, the present disclosure is not limited to this.

A gate terminal of the eighth transistor TR8 may be connected to the first inverting node NDOB1 of the single-stage circuit 210. Also, the eighth transistor TR8 may turn on and off according to the voltage level at the first inverting node NDOB1.

A source terminal of the eighth transistor TR8 may be connected to the second high driving voltage VDD2, and a drain terminal thereof may be connected to a second output node NDO2. With this structure, when an input voltage VI of a low-voltage level is supplied to the gate terminal of the eighth transistor TR8, an output voltage VO of a high-voltage level may be produced at the second output node NDO2.

A gate terminal of the tenth transistor TR10 may be connected to the second inverting node NDOB2. Also, a source terminal of the tenth transistor TR10 may be electrically connected to the second low driving voltage VSS2, and a drain terminal thereof may be connected to the second output node NDO2.

As described above, an inverted output voltage VOB having the same waveform as the inverted voltage VIB may be produced at the second inverting node NDOB2. The tenth transistor TR10 may turn on and off by the inverted output voltage VOB. With this structure, when an inverted voltage VIB of a high-voltage level is supplied, an inverted output voltage VOB of a low-voltage level may be produced at the second output node NDO2.

The twelfth transistor TR12 may limit the amount of current flowing to the fourth path circuit PT4.

A gate terminal of the twelfth transistor TR12 may be supplied with a third bias voltage VBIA3.

Also, a source terminal of the twelfth transistor TR12 may be connected to the second low driving voltage VSS2, and a drain terminal thereof may be connected to the source terminal of the tenth transistor TR10.

Figure 3:
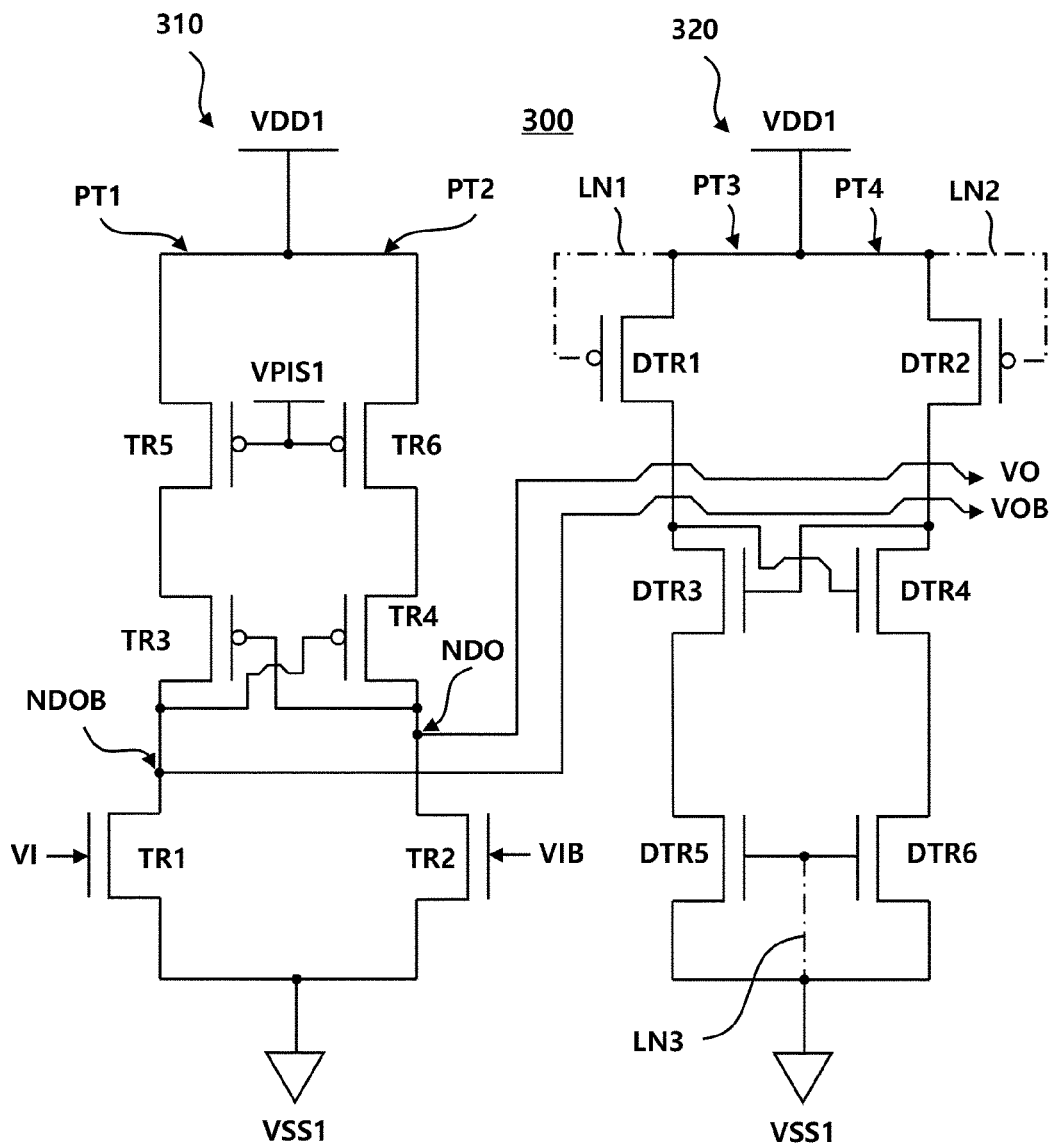
FIG. 3 is a circuit diagram of a level shifter including a dummy circuit.

FIG. 3 is a circuit diagram of a level shifter including a dummy circuit.

Referring to FIG. 3, the level shifter 300 may include a level shifter circuit 310 and a dummy circuit 320.

The level shifter circuit 310 may include a first transistor TR1 that turns on and off by an input voltage VI to produce a voltage at an inverting node NDOB to have an inverted waveform of the input voltage VI, and a second transistor TR2 that turns on and off by an inverted voltage VIB having the inverted waveform of the input voltage VI to produce a voltage at an output node NDO to have the same waveform as the input voltage VI.

The level shifter circuit 310 may have the same circuit configuration as the level shifter (see 100 of FIG. 1) depicted in FIG. 1.

Accordingly, a detailed description of the level shifter circuit 310 will be omitted.

The dummy circuit 320 may include a first dummy transistor DTR1 whose gate terminal and source terminal are short-circuited by a first short-circuit line LN1, and a second dummy transistor DTR2 whose gate terminal and source terminal are short-circuited by a second short-circuit line LN2, and may operate as a two-stage level shifter circuit (two-stage circuit of FIG. 2) when the first short-circuit line LN1 and the second short-circuit line LN2 are removed.

The dummy circuit 320 may include a third path circuit PT3 and a fourth path circuit PT4.

The third path circuit PT3 may include the first dummy transistor DTR1, a third dummy transistor DTR3, and a fifth dummy transistor DTR5 that are disposed in series between the first high driving voltage VDD1 and the first low driving voltage VSS1.

Also, the fourth path circuit PT4 may include the second dummy transistor DTR2, a fourth dummy transistor DTR4, and a sixth dummy transistor DTR6 that are disposed in series between the first high driving voltage VDD1 and the first low driving voltage VSS1.

A drain terminal of the first dummy transistor DTR1 may be electrically connected to a gate terminal of the fourth dummy transistor DTR4, and a drain terminal of the second dummy transistor DTR2 may be electrically connected to a gate terminal of the third dummy transistor DTR3.

Also, the fifth dummy transistor DTR5 may be configured to limit the amount of current flowing to the first dummy transistor DTR1 and the third dummy transistor DTR3.

Also, the sixth dummy transistor DTR6 may be configured to limit the amount of current flowing to the second dummy transistor DTR2 and the fourth dummy transistor DTR4.

The dummy circuit 320 may include the same transistors as the two-stage circuit (see 220 of FIG. 2) depicted in FIG. 2, but there may be differences in wiring between them.

In a comparison between FIG. 2 and FIG. 3, the first dummy transistor DTR1 may correspond to the seventh transistor TR7, the second dummy transistor DTR2 may correspond to the eighth transistor TR8, the third dummy transistor DTR3 may correspond to the ninth transistor TR9, the fourth dummy transistor DTR4 may correspond to the tenth transistor TR10, the fifth dummy transistor DTR5 may correspond to the eleventh transistor TR11, and the sixth dummy transistor DTR6 may correspond to the twelfth transistor TR12.

When the level shifter 300 operates as a single-stage level shifter, the dummy circuit 320 may be wired in such a way as to prevent electric current from flowing in it. For example, the gate terminal and source terminal of the first dummy transistor DTR1 may be short-circuited by the first short-circuit line LN1. Also, the gate terminal and source terminal of the second dummy transistor DTR2 may be short-circuited by the second short-circuit line LN2. Also, gate terminals and source terminals of the fifth dummy transistor DTR5 and sixth dummy transistor DTR6 may be short-circuited by a third short-circuit line LN3.

The design of the level shifter 300 may be altered into a two-stage level shifter. In order to alter the design of the level shifter 300 into a two-stage level shifter, the wiring needs to be altered as in FIG. 2.

For example, when the dummy circuit 320 operates as a two-stage level shifter circuit, the output node NDO of the level shifter circuit 310 may be electrically connected to the gate terminal of the first dummy transistor DTR1, and the inverting node NDOB thereof may be electrically connected to the gate terminal of the second dummy transistor DTR2.

Also, the first short-circuit line LN1, the second short-circuit line LN2, and the third short-circuit line LN3 may be removed.

Figure 4:
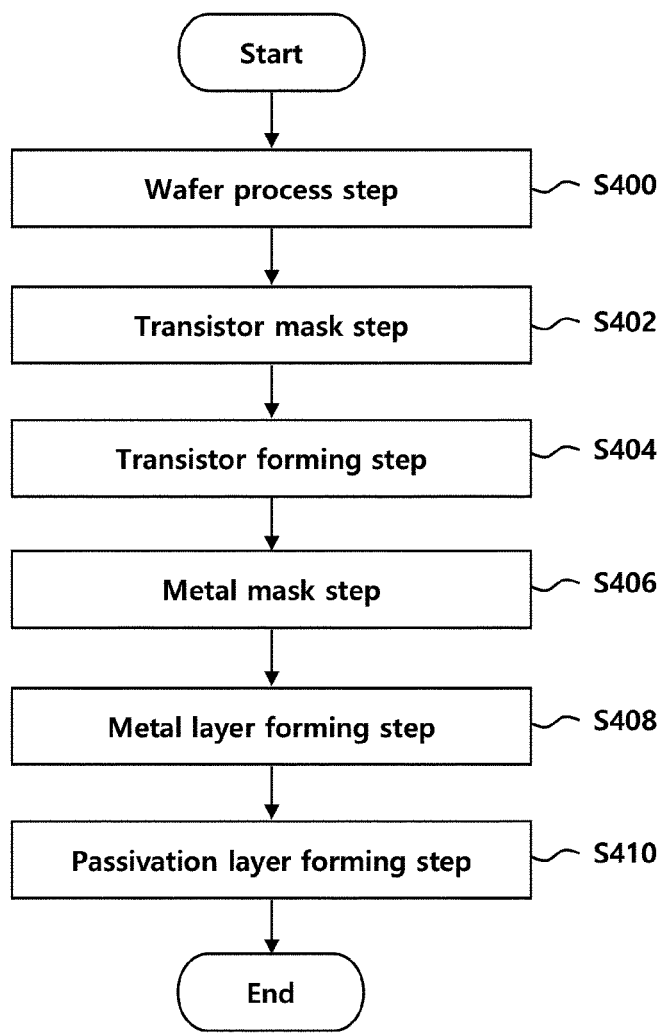
FIG. 4 is a flowchart of a manufacturing method of a level shifter including a dummy circuit.

FIG. 4 is a flowchart of a manufacturing method of a level shifter including a dummy circuit.

Referring to FIG. 4, a wafer process for providing a substrate for the level shifter may be performed (S400).

Next, a transistor mask may be placed (S402), and transistors may be formed in alignment with the transistor mask (S404). In this case, the transistor mask may be comprised of a plurality of masks, and some components of the transistors may be formed in alignment with each mask.

Next, a metal mask may be placed (S406), and a metal layer may be formed in alignment with the metal mask (S408).

The metal layer may include wiring lines. The manufacturer or designer may have the wiring lines formed in different ways by altering the metal mask. Also, the manufacturer or designer may manufacture a single-stage level shifter or a two-stage level shifter by using two types of metal mask.

In manufacturing the single-stage level shifter, in the metal layer forming step S408, wiring may be installed in such a way that the first transistor turns on and off by an input voltage to produce a voltage at an inverting node to have an inverted waveform of the input voltage, in such a way that the second transistor turns on and off by an inverted voltage having the inverted waveform of the input voltage to produce a voltage at an output node to have the same waveform as the input voltage, in such a way that the gate terminal and source terminal of the first dummy transistor are short-circuited, and in such a way that the gate terminal and source terminal of the second dummy transistor are short-circuited.

Also, wiring may be installed in such a way that the gate terminal and source terminal of the fifth dummy transistor and the gate terminal and source terminal of the sixth dummy transistor are short-circuited.

A passivation layer may be formed on the metal layer so as to insulate the metal layer (S410). Also, the output node and the inverting node may be exposed through the passivation layer.

Figure 5:
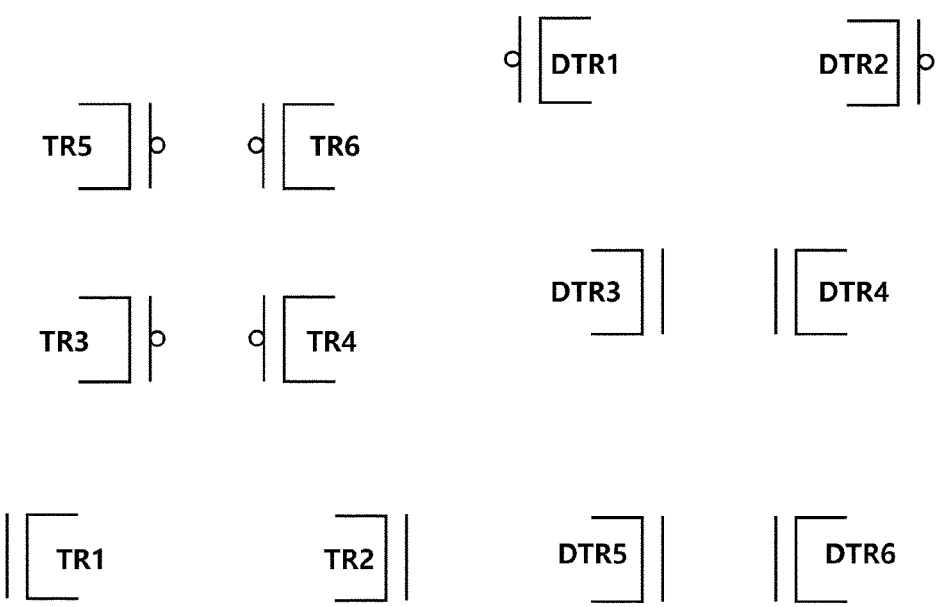
FIG. 5 is a view showing patterns for forming transistors.
Figure 6A:
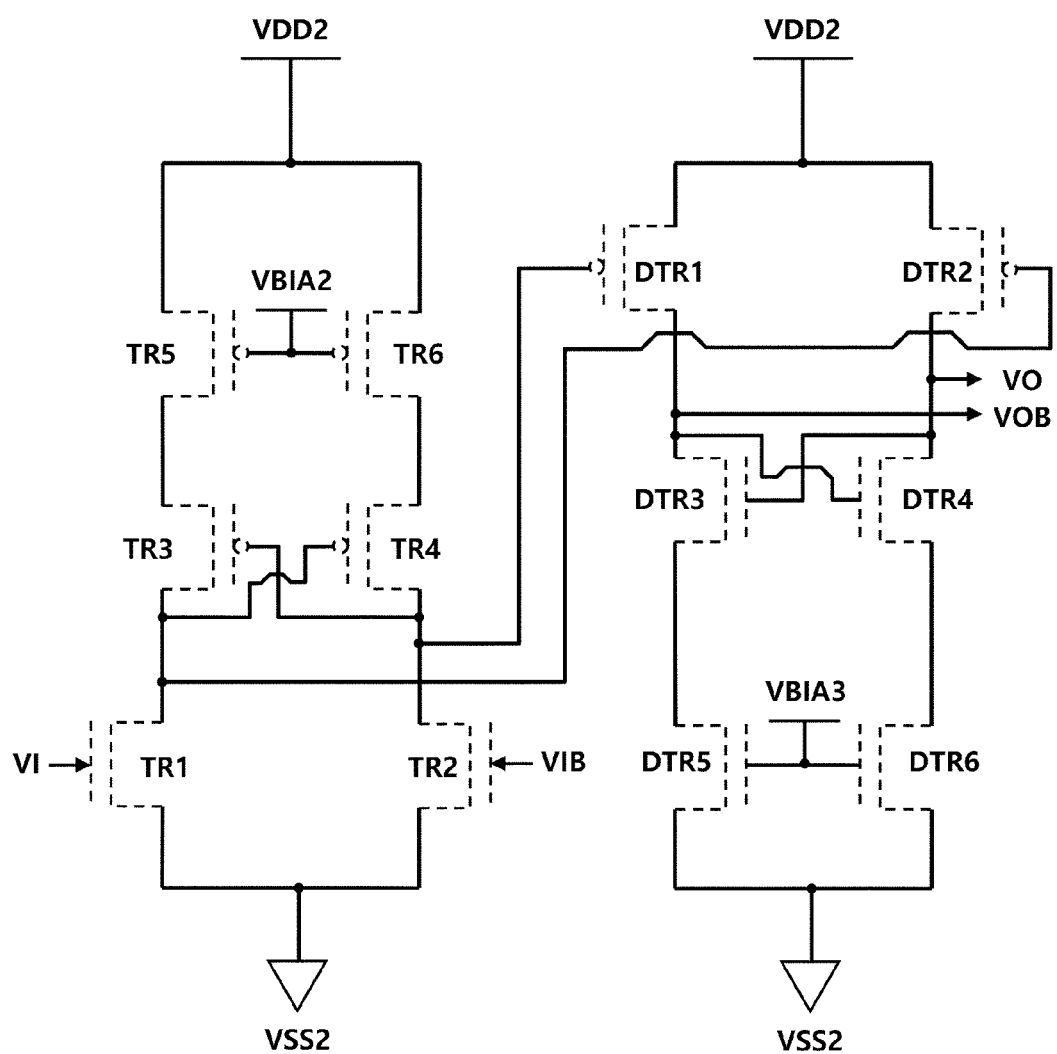
FIG. 6A is a view showing metal layer patterns for forming a two-stage level shifter.
Figure 6B:
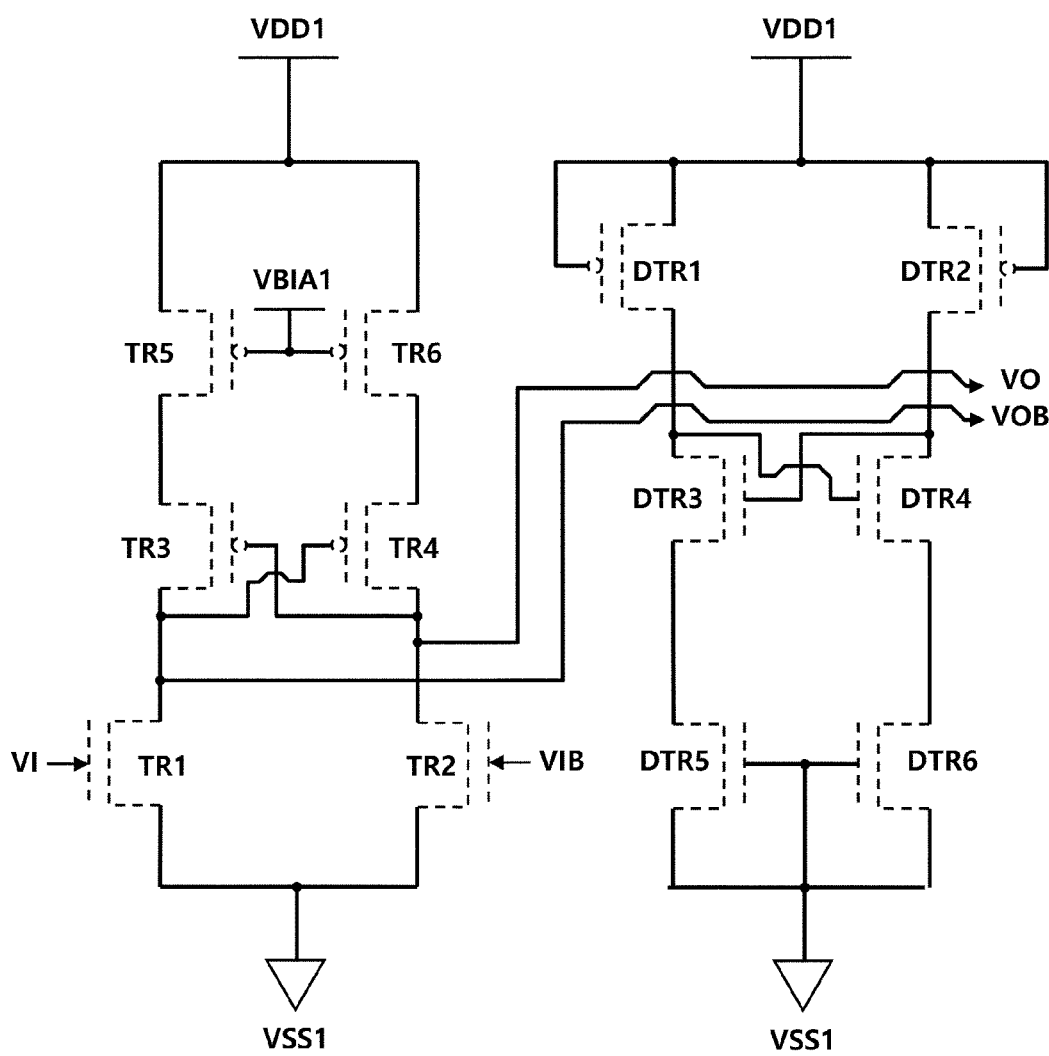
FIG. 6B is a view showing metal layer patterns for forming a single-stage level shifter.

FIG. 5 is a view showing patterns for forming transistors. FIG. 6A is a view showing metal layer patterns for forming a two-stage level shifter. FIG. 6B is a view showing metal layer patterns for forming a single-stage level shifter.

Referring to FIG. 5, FIG. 6A, and FIG. 6B, transistors TR1 to TR6 and DTR1 to DTR6 may be formed for both the single-stage level shifter and the two-stage level shifter, as shown in FIG. 5.

Afterwards, when forming the two-stage level shifter, the manufacturer may have metal layer patterns formed as shown in FIG. 6A. The level shifter thus manufactured may be a two-stage level shifter.

When forming the single-stage level shifter after forming the transistors TR1 to TR6 and DTR1 to DTR6 as shown in FIG. 5, the manufacturer may form metal layer patterns as shown in FIG. 6B. The level shifter thus manufactured may be a single-stage level shifter.

As explained above, according to an embodiment of the present disclosure, altering the design of a level shifter can be made easier, and a single-stage shifter or a two-stage level shifter can be selected simply by altering the wiring in the manufacturing process.

What is claimed is:

1. A level shifter comprising:
a first path circuit in which a first transistor and a third transistor are disposed in series between a high driving voltage and a low driving voltage;
a second path circuit in which a second transistor and a fourth transistor are disposed in series between the high driving voltage and the low driving voltage;
a third path circuit in which a first dummy transistor and a third dummy transistor are disposed in series between the high driving voltage and the low driving voltage; and
a fourth path circuit in which a second dummy transistor and a fourth dummy transistor are disposed in series between the high driving voltage and the low driving voltage,
wherein an input voltage is fed to a gate terminal of the first transistor, an inverted voltage having a waveform inverted from a waveform of the input voltage is fed to a gate terminal of the second transistor, a drain terminal of the first transistor is electrically connected to an inverting node, a drain terminal of the second transistor is electrically connected to an output node, the output node is electrically connected to a gate terminal of the fourth transistor, and the inverting node is electrically connected to a gate terminal of the third transistor, and
wherein a gate terminal and a source terminal of the first dummy transistor are short-circuited by a first short-circuit line and a gate terminal and a source terminal of the second dummy transistor are short-circuited by a second short-circuit line.

2. The level shifter of claim 1, wherein the first path circuit further comprises a fifth transistor that limits the amount of a current flowing to the first transistor and the third transistor and the second path circuit further comprises a sixth transistor that limits the amount of a current flowing to the second transistor and the fourth transistor.

3. The level shifter of claim 1, wherein a drain terminal of the first dummy transistor is electrically connected to a gate terminal of the fourth dummy transistor and a drain terminal of the second dummy transistor is electrically connected to a gate terminal of the third dummy transistor.

4. The level shifter of claim 3, wherein the third path circuit further comprises a fifth dummy transistor that limits the amount of a current flowing to the first dummy transistor and the third dummy transistor and the fourth path circuit further comprises a sixth dummy transistor that limits the amount of a current flowing to the second dummy transistor and the fourth dummy transistor.

5. The level shifter of claim 4, wherein gate terminals and source terminals of the fifth dummy transistor and the sixth dummy transistor are short-circuited.

6. A level shifter comprising:
a level shifter circuit comprising a first transistor that turns on and off according to an input voltage to produce a voltage at an inverting node to have a waveform inverted from a waveform of the input voltage and a second transistor that turns on and off according to an inverted voltage having the waveform inverted from the waveform of the input voltage to produce a voltage at an output node to have the same waveform as that of the input voltage; and
a dummy circuit comprising transistors disposed in the form of a two-stage level shifter circuit, wherein a first dummy transistor and a second dummy transistor among the transistors have gate terminals and source terminals short-circuited.

7. The level shifter of claim 6, wherein, when the dummy circuit operates as the two-stage level shifter circuit, the output node is electrically connected to the gate terminal of the first dummy transistor and the inverting node is electrically connected to the gate terminal of the second dummy transistor.

8. The level shifter of claim 7, wherein, when the dummy circuit operates as the two-stage level shifter circuit, an output voltage is determined according to a voltage at a drain terminal of the second dummy transistor and an inverted output voltage is determined according to a voltage at a drain terminal of the first dummy transistor.

9. The level shifter of claim 6, wherein the dummy circuit further comprises a first dummy limiting transistor for limiting the amount of a current flowing to the first dummy transistor and a second dummy limiting transistor for limiting the amount of a current flowing to the second dummy transistor.

10. The level shifter of claim 9, wherein a gate terminal and a source terminal of the first dummy limiting transistor and a gate terminal and a source terminal of the second dummy limiting transistor are short-circuited by a third short-circuit line.

11. The level shifter of claim 6, wherein the first transistor and the first dummy transistor are different types of transistors and the second transistor and the second dummy transistor are different types of transistors.

* * * * *